United States Patent
Manakli

(10) Patent No.: US 8,713,499 B2
(45) Date of Patent: Apr. 29, 2014

(54) ELECTRON-BEAM LITHOGRAPHY METHOD WITH CORRECTION OF LINE ENDS BY INSERTION OF CONTRAST PATTERNS

(75) Inventor: Serdar Manakli, Meyrie (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/641,119

(22) PCT Filed: Apr. 13, 2011

(86) PCT No.: PCT/EP2011/055843
§ 371 (c)(1),
(2), (4) Date: Nov. 14, 2012

(87) PCT Pub. No.: WO2011/128383
PCT Pub. Date: Oct. 20, 2011

(65) Prior Publication Data
US 2013/0198707 A1 Aug. 1, 2013

(30) Foreign Application Priority Data
Apr. 15, 2010 (FR) ...................................... 10 52863

(51) Int. Cl.
*G06F 17/50* (2006.01)
(52) U.S. Cl.
USPC ................. 716/111; 716/51; 716/53; 716/54; 716/55
(58) Field of Classification Search
USPC .................. 716/51, 53, 54, 55, 111
See application file for complete search history.

(56) References Cited

U.S. PATENT DOCUMENTS

| | | | |
|---|---|---|---|
| 5,849,437 A | 12/1998 | Yamazaki et al. | |
| 6,316,164 B1 | 11/2001 | Parker et al. | |
| 6,361,911 B1 | 3/2002 | Tsai et al. | |
| 7,494,751 B2 | 2/2009 | Melvin, III et al. | |
| 2001/0044055 A1 | 11/2001 | Yamada | |
| 2003/0054580 A1 | 3/2003 | Yamamoto et al. | |

FOREIGN PATENT DOCUMENTS

| | | |
|---|---|---|
| JP | 2004-71767 A1 | 3/2004 |
| WO | 2007/129135 A1 | 11/2007 |
| WO | 2011/128393 A1 | 10/2011 |

OTHER PUBLICATIONS

Keisuke Tsudaka, et al., "Simulation-Based Automatic Optical Proximity Effect Correction Adaptive for Device Fabrication", Japanese Journal of Applied Physics, Dec. 1997, pp. 7477-7481, vol. 36, Part 1, No. 12B.

(Continued)

*Primary Examiner* — Sun Lin
(74) *Attorney, Agent, or Firm* — Baker & Hostetler LLP

(57) ABSTRACT

A method of electron-beam lithography is provided, notably for technologies of critical dimension of the order of 22 nm. In such methods applied notably to networks of lines, the methods of the prior art do not offer precise and efficient correction of the shortenings of line ends. The method provided solves this problem by carrying out the insertion of contrast intensification structures of types which are optimized for the structure of the lines to be corrected. The method allows the semi-automatic or automatic calculation of the dimensions and locations of said structures. Advantageously, these calculations may be modeled to produce a target design, derived from libraries of components. They may be supplemented with a joint optimization of the size of the etchings and of the radiated doses, as a function of the process energy latitude.

10 Claims, 7 Drawing Sheets

(56) References Cited

OTHER PUBLICATIONS

Keeho Kim, et al., "Optical Proximity Correction Methodology to Counteract Mask Error Effects in Sub-0.25 um Lithography Generations", Japanese Journal of Applied Physics, Dec. 1998, pp. 6681-6685, vol. 37, Part 1, No. 12B.

L.E. Ocola, "Nanoscale Geometry Assisted proximity Effect Correction for Electron Beam Direct Write Nanolithography", Journal of Vacuum Science and Technology B (Microelectronics and Nanometer Structures), Dec. 1, 2009, pp. 256-2571, vol. 27, No. 6, American Vacuum Society by the American Institute of Physics, USA, XP002613384.

S. Manakli, et al., "New Electron Beam Proximity Effects Correction Approach for 45 and 32 nm Nodes", Japanese Journal of Applied Physics, Part 1, Aug. 4, 2006, pp. 6462-6467, vol. 45, No. 8A, The Japan Society of Applied Physics, XP002613385.

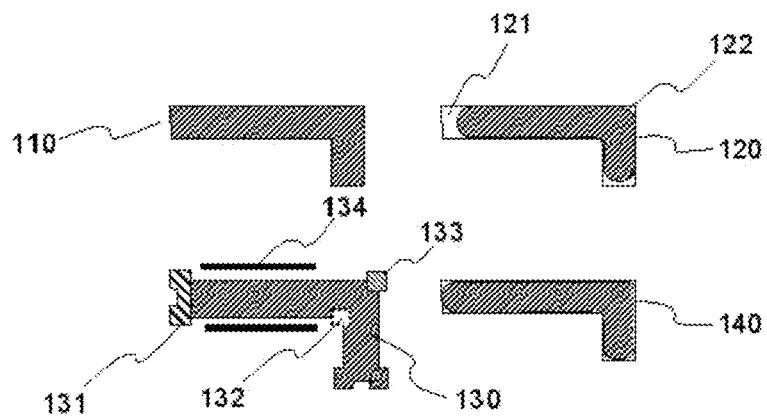
FIG.1
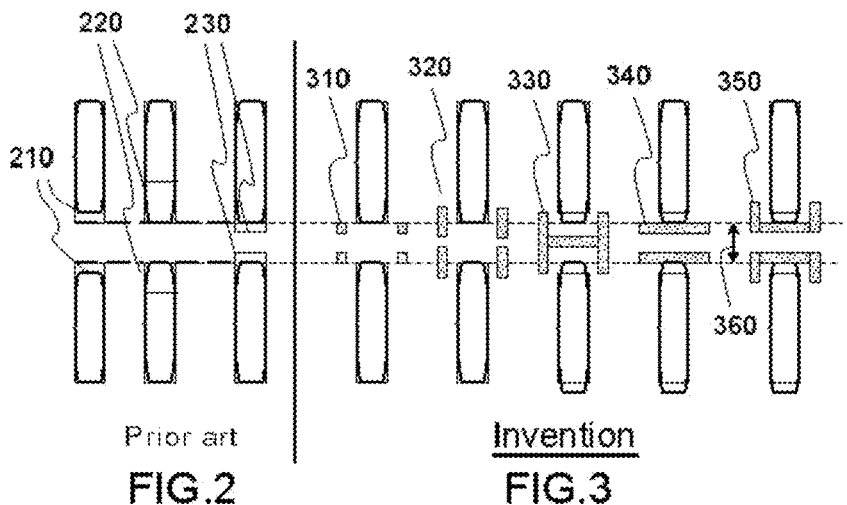
Prior art
FIG.2
Invention
FIG.3
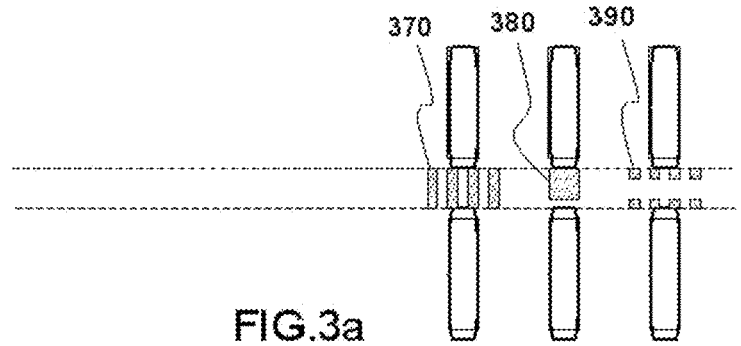
FIG.3a

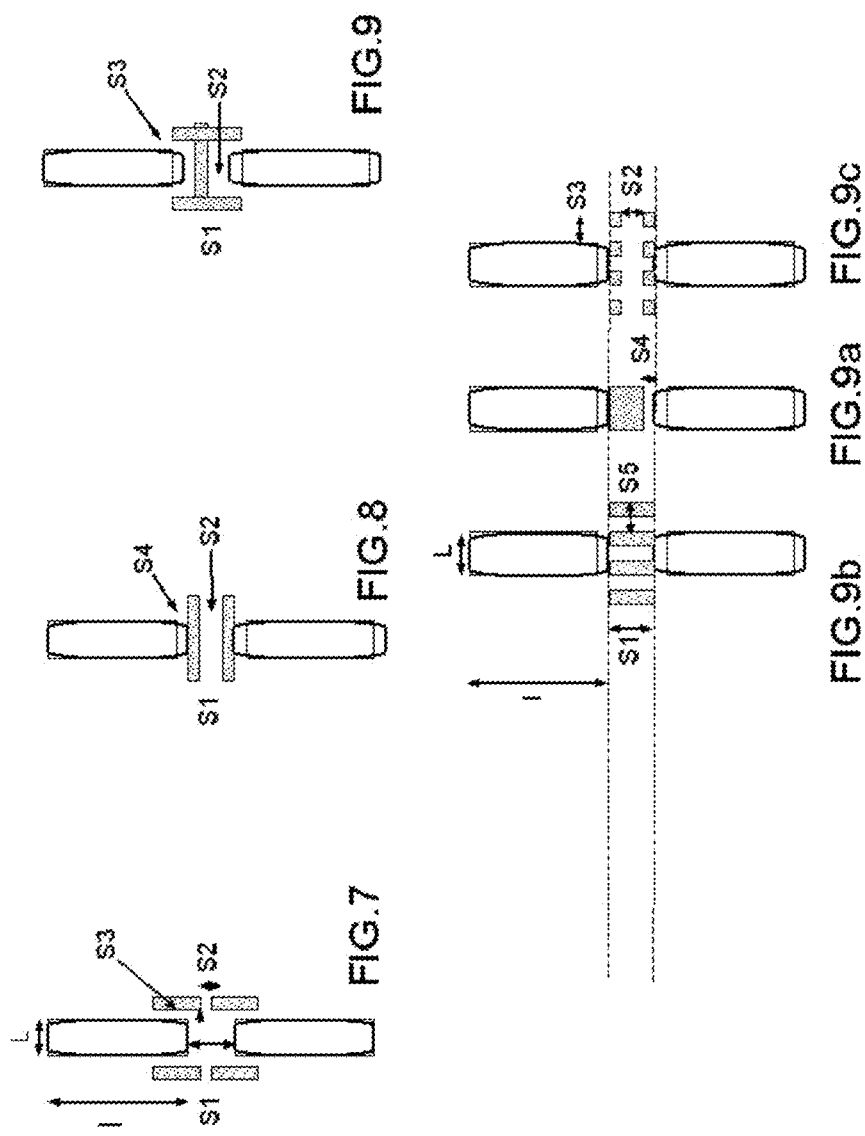

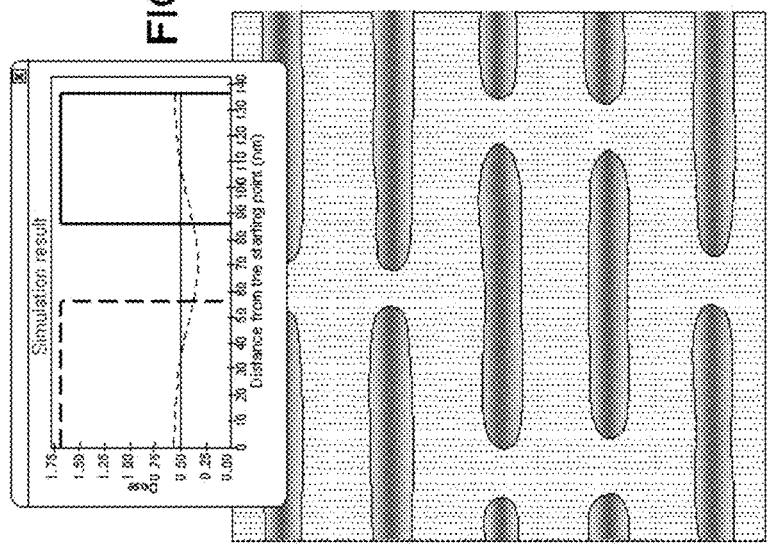
FIG.10b
FIG.10c
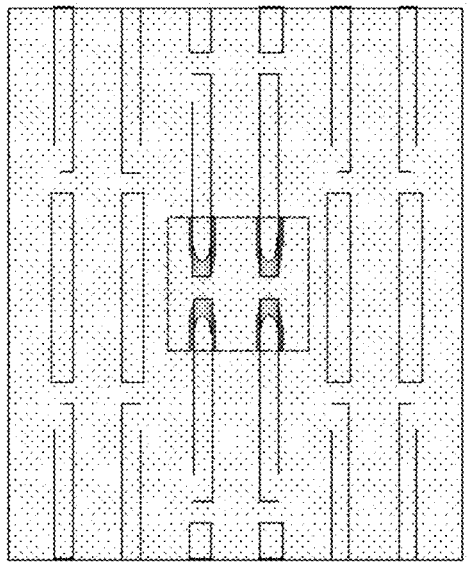
FIG.10a

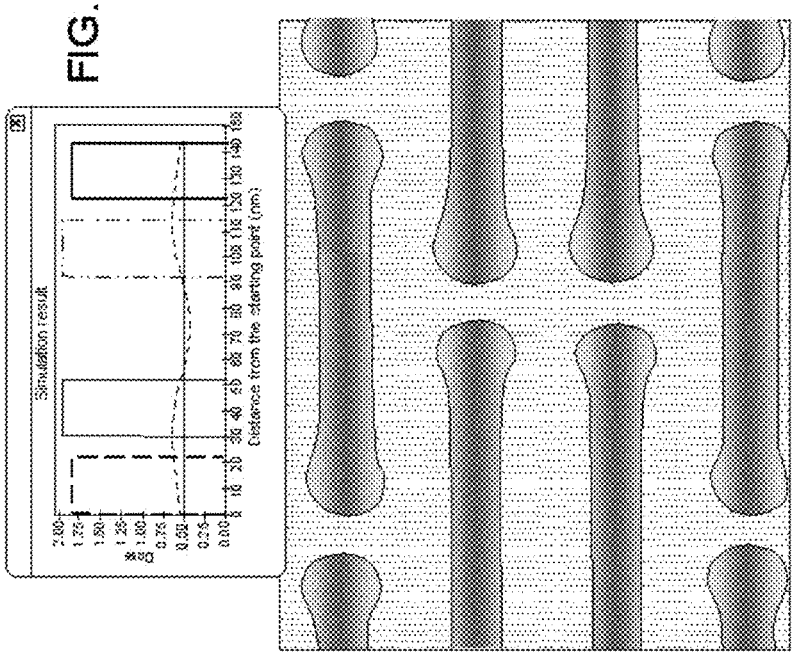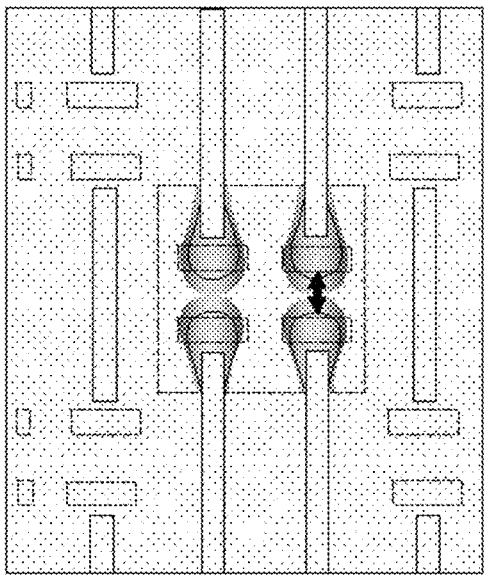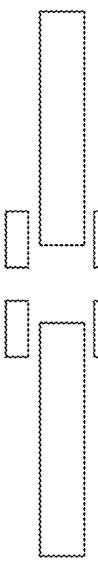

ELECTRON-BEAM LITHOGRAPHY METHOD WITH CORRECTION OF LINE ENDS BY INSERTION OF CONTRAST PATTERNS

CROSS-REFERENCE TO RELATED APPLICATIONS

This application is a National Stage of International patent application PCT/EP2011/055843, filed on Apr. 13, 2011, which claims priority to foreign French patent application No. FR 1052863, filed on Apr. 15, 2010, the disclosures of which are incorporated by reference in their entirety.

BACKGROUND

The present invention applies to the domain of electron-beam lithography. To allow the etching of patterns whose critical dimension is below 50 nm, it is necessary to integrate into the methods of optical photolithography schemes for correcting the optical distortions that are increasingly complex both at the mask design and production stage and at the exposure stage. The costs of the equipment and developments for a new generation of technology consequently increase in very high proportions. Today, the critical dimensions accessible in photolithography are greater than or equal to 65 nm. The 32-45 nm generation is undergoing development and there is no viable solution envisaged for technological nodes below 22 nm. For its part, electron-beam lithography already allows the etching of 22-nm patterns; it does not require any mask and offers a fairly short development time, thus allowing better reactivity and flexibility in the realization of improvements to the technologies and to the designs. On the other hand, the production times are structurally substantially higher than in photolithography since it is necessary to carry out step-wise exposure (with a "stepper"), whereas photolithography requires only layer-wise exposure.

The electron beam or beams used to perform the etching of a pattern scatter notably over short distance (forward scattering or blur) in the resin and the substrate on the edges of the center of the beam, thus increasing the size of the beam and reducing its contrast. Moreover, the electrons are completely backscattered over a long distance (backward scattering). In particular, the line ends within dense networks will be shortened ("line end shortening" or LES), thus affecting the functionality of the component and therefore decreasing production efficiency.

A certain number of prior art methods, in the domains of photolithography and electron-beam lithography, have attempted to afford corrections to this LES phenomenon. Such is notably the case in photolithography of the methods providing for the modifications of the patterns to be etched, notably by extending their surface at the line end, such as those disclosed by K. Tsudaka et al., Japanese Journal of Applied Physics, Vol. 36 (1997), pp. 7477-7481, K. Kim et al., Japanese Journal of Applied Physics, Vol. 37 (1998), pp. 6681-6685 as well as by U.S. Pat. No. 7,494,751.

Similar methods have been applied in electron-beam lithography, such as those disclosed notably by S. Manakli et al., Japanese Journal of Applied Physics, Vol. 45, No. 8A, 2006, pp. 6462-6467, in which the dimensions of the lines are modified as a function of rules, and the international patent application published under the number WO2007/129135, in which a line is replaced with several lines of chosen widths and spacings. However, a solution remains to be found allowing the correction of LESs while affording sufficient resolution for technological nodes of less than or equal to 22 nm.

SUMMARY OF THE INVENTION

The present invention solves this problem by allowing the calculation and then the insertion of contrast improvement patterns ("Contrast Improvement Features" or CIFs) into the networks of lines to be etched.

For this purpose, the invention provides for a method of electron-beam lithography of networks of lines on a resin coated substrate comprising a step of selecting at least two opposite lines of the network each having a critical line end in opposition, a step of determining corrections to be applied to the geometry of the end of said lines, said method being characterized in that it furthermore comprises a step of determining a type of at least one contrast intensification structure chosen from among several, said contrast intensification structure comprising at least two elements, at least one of which being located in-between said two opposite lines, a step of calculating the characteristic dimensions and the location in the gap between the two opposite critical line ends of said contrast intensification structure, a step of generating said structure and a step of placing said structure in relation to the ends of said opposite critical line ends as a function of the parameters determined.

Advantageously, said contrast intensification structure is an H-like structure, whose branches each have inherent dimensions of between about 5 and 50 nm, whose branch perpendicular to the direction of said critical line is placed in the middle of the gap at a distance S2 from the end of said critical line along the direction parallel to said critical line of between about 5 and 50 nm and whose branches parallel to the direction of said critical line are placed in a symmetric manner on either side of said critical line at a distance S3 perpendicular to the direction of said critical line of between about 5 and 50 nm.

Advantageously, said contrast intensification structure consists of two parallel bars placed in a symmetric manner in the gap along a direction perpendicular to said critical line, each of the bars having inherent dimensions of between about 5 and 50 nm, spaced apart by a distance S2 of between about 5 and 100 nm and each spaced from the end of said critical line by a distance S4 perpendicular to said critical line of between about 5 and 50 nm.

Advantageously, said two parallel bars furthermore comprise at each of their ends four regions of inherent dimensions of between about 5 and 50 nm.

Advantageously, said contrast intensification structure consists of at least two CIFs (CIF1, . . . CIF$_i$ . . . ) having inherent dimensions ($L_i$, $I_i$) of substantially between 5 and 50 nm, said patterns being separated from one another by a distance S5 perpendicular to the critical lines of substantially between 5 and 20 nm, the number of patterns being chosen in such a way that the exterior regions are placed in a symmetric manner on either side of the edges of the critical lines at a distance S3 perpendicular to the direction of said critical lines of between about 5 and 50 nm.

Advantageously, said contrast intensification structure consists of two rows of substantially square regions passing through the interior of the gap, of inherent dimension of substantially between 5 and 20 nm, the two rows being separated by a distance S5 in the direction of the critical line of substantially between 5 and 50 nm, the number of regions being chosen in such a way that the exterior regions are placed in a symmetric manner on either side of the edges of the critical lines at a distance S3 perpendicular to the direction of said critical lines of between about 5 and 50 nm.

Advantageously, said types of contrast intensification structures, their dimensions and their locations are determined by a model for automatically determining a target design comprising the critical lines and the optimal contrast intensification structures.

Advantageously, the method of the invention furthermore comprises at least one step of calculating at least one dimension of said critical line and at least one dimension of a contrast intensification structure and a step of calculating modulation of doses on said critical line and contrast intensification structure, said calculations being related by an optimization criterion chosen from the group comprising the process energy latitude, the shape of the contrast intensification structure, the position of said contrast intensification structure, a combination of the latter with the process energy latitude.

To implement the method, the invention also provides for a computer program comprising program code instructions configured for the execution of a method of electron-beam lithography of networks of lines on a resin-coated substrate when the program is executed on a computer, said program comprising a module for selecting at least two opposite lines of the network each having a critical line end in opposition, a module for determining corrections to be applied to the geometry of the end of said lines, said computer program being characterized in that it furthermore comprises a module for determining a type of at least one contrast intensification structure chosen from among several, said contrast intensification structure comprising at least two elements, at least one of which being located in-between said two opposite lines, a module for calculating the characteristic dimensions and the location in the gap between the two opposite critical line ends of said contrast intensification structure, a module for generating said structure and a module for placing said structure in relation to the ends of said opposite critical line ends as a function of the parameters determined.

Advantageously, the program of the invention furthermore comprises a module for calculating at least one dimension of said critical line and at least one dimension of a contrast intensification structure and a module for calculating modulation of doses on said critical line and contrast intensification structure, said calculations being related by an optimization criterion chosen from the group comprising the process energy latitude, the shape of the contrast intensification structure, the position of said contrast intensification structure, a combination of the latter with the process energy latitude.

The invention uses a small number of CIF type geometries whose calculation and placement may be automated, thereby permitting the modification of the libraries of standard components by integrating suitable programs into computer-aided design tools.

Although there are a reduced number thereof so as to facilitate this automation of the conversion of the libraries of components, these CIFs have a large number of parameters whose variation, combined if appropriate with that of the parameters of the base patterns of the network allows very fine correction of the proximity effects and very faithful reproduction of said base patterns.

BRIEF DESCRIPTION OF THE DRAWINGS

The invention will be better understood, its various characteristics and advantages will emerge from the description which follows of several exemplary embodiments and of its appended figures wherein:

FIG. 1 represents a view of a pattern to be reproduced and of a reproduced pattern, without correction of the LESs and with correction of the LESs in a photolithography method of the prior art;

FIG. 2 represents a view of a pattern to be reproduced and of a reproduced pattern, without correction of the LESs and with correction of the LESs in an electron-beam lithography method of the prior art;

FIGS. 3 and 3a represent several exemplary embodiments of corrections of the LESs by a lithography method according to the invention;

FIG. 7 illustrates the calculation of the parameters of a CIF in one of the embodiments of the invention;

FIG. 8 illustrates the calculation of the parameters of a CIF in another of the embodiments of the invention;

FIGS. 9, 9a, 9b and 9c illustrate the calculation of the parameters of a CIF in yet several other embodiments of the invention;

FIGS. 10a, 10b and 10c illustrate the results of an LES correction method of the prior art;

FIGS. 11a, 11b, 11c and 11d illustrate the results of an LES correction method in an embodiment of the invention.

DETAILED DESCRIPTION

Figure 4:
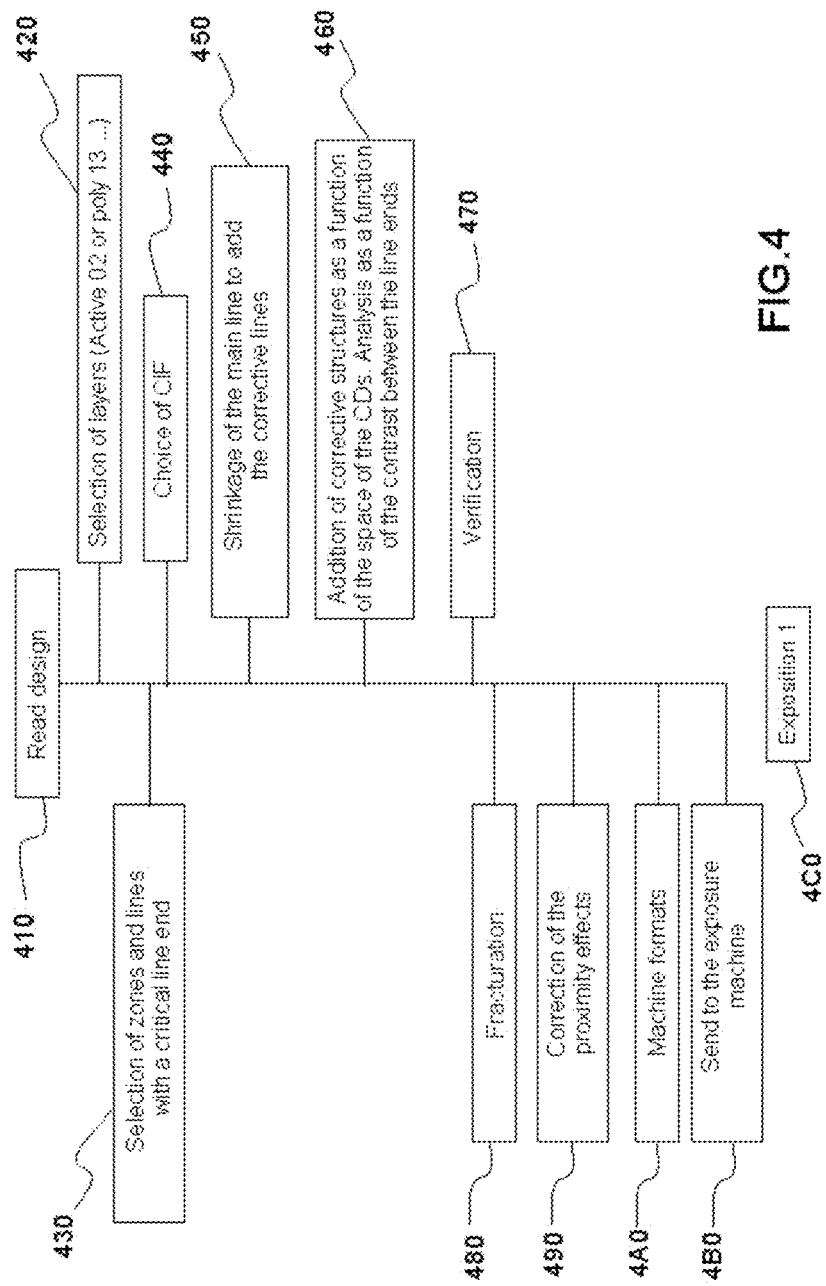
FIG. 4 is a flowchart of the processing implemented to carry out a correction of the LESs according to one embodiment of the invention.

FIG. 1 represents a view of a pattern to be reproduced and of a reproduced pattern, without correction of the LESs and with correction of the LESs in a photolithography method of the prior art.

The pattern 110 to be reproduced is transferred into the resin in the form of a deformed image 120. In particular, this image comprises a line end shortening (LES), 121 and corner roundings such as 122, on account of the contrast reduction effect at the extremities of the pattern.

The pattern 130 to be reproduced is modified by adding sub-resolved patterns such as a "hammerhead", 131, a "serif", 133, or one or more scattering bars, 134. The pattern can also be a subtraction of material such as a "mousebite" 132. The impact of an electron beam modulated in a particular manner with these sub-resolved patterns creates an energy distribution over the sample which improves the contrast and transfers the pattern modified by these additions and subtractions into the resin with an image, 140, identical to the initial pattern before additions/subtractions.

FIG. 2 represents a view of a pattern to be reproduced and of a reproduced pattern, without correction of the LESs and with correction of the LESs in an electron-beam lithography method of the prior art.

In a method of electron-beam lithography by direct writing, a line end shortening LES effect, 210, is also apparent. This LES effect may be corrected by modifying the geometry of the line end, by lengthening it, as at 220 or 230.

FIGS. 3 and 3a represent several exemplary embodiments of corrections of the LESs by a lithography method according to the invention.

Essentially, networks are considered in which two line ends situated in opposition constitute a gap between them.

The idea of the invention is to insert into the network to be etched contrast improvement patterns, 310, 320, 330, 340, 350, 370, 380, 390 of appropriate geometry and location. The way of calculating the geometry and the location of these patterns will be detailed as a commentary to FIGS. 4 to 9. Two types of patterns are mainly used:

- the patterns of type 310 and 320 no part of which encroaches into a zone situated between two line ends; as a general rule, patterns of these types are chosen when the characteristic dimension of this zone, 360, is less than about 10 nm; more specifically, in an empirical manner, patterns of type 310 will be chosen when the dimension 360 is less than or equal to 5 nm and patterns of type 320 when the dimension 360 is greater than 5 nm but less than or equal to 10 nm;
- the patterns of types 330, 340 or 350 in which there exists at least one element perpendicular to the lines and situated in the zone between two line ends;
- the patterns of type 370, in which a single pattern is inserted into the gap;
- the patterns of type 380, in which the largest dimension of each of the patterns is parallel to the lines of the network;
- the patterns of type 390, in which several regions constituting two rows aligned perpendicularly to the lines of the network are inserted into the gap.

Other types of pattern are possible, without departing from the generality of the invention.

The line end constrictions increase in proportion for the pattern to be etched for the finest technologies. For the 32-45 nm technologies, the constriction attains 30 nm per line edge. If the spacing is sufficient (typically greater than 10 nm), one of the configurations 330, 340, 350 will be chosen by preference, in which the overdosages applied to the CIF pattern parts situated in the spacing allow an increase in the energy latitude (EL) of the method (rectification of the slope of the dose curve) and therefore an increase in the contrast. When the space between line ends is too restricted to allow the insertion of a pattern having a part in this gap, one of the configurations 310, 320 is chosen.

FIG. 4 is a flowchart of the processing implemented to carry out a correction of the LESs according to one embodiment of the invention.

In a manner conventional for a person skilled in the art, the method of the invention begins with a step, 410, of reading the design. The layout of the patterns to be etched is conventionally encoded in files in the GDS II (Graphic Data System version2) or OASIS (Open Artwork System Interchange Standard) format.

The layers where the patterns must be etched are selected thereafter in the course of a step 420.

The zones, lines and critical line ends, that is to say those having to form the subject of a specific processing, are identified in the course of a step 430. The threshold below which the line ends must form the subject of a specific processing depends on the technology; thus for a 22-nm technology, the critical line ends will be those having a gap of less than or equal to about 30 nm. Generally, all the line ends for which the constrictions are greater than 10% will be processed. The value of the threshold therefore depends on the technology.

In the course of a step 440, one chooses the type of the CIF pattern to be implanted as a function of the configuration of the line end to be processed. For line end spaces of less than 5 nm, only a CIF of the type 310 of FIG. 3 is possible. For line end spaces of between 5 and 10 nm, a CIF of the type 320 is favored, although a CIF of type 310 is also possible, with less good performance in terms of contrast increase.

In the course of a step 450, the shrinkage of the lines is calculated and carried out in the case where, on output from step 440, it has been decided to implant a CIF of type 330, 340, 350, 370, 380 or 390. The calculation is performed as indicated further on as a commentary to FIGS. 8, 9, 9a, 9b and 9c.

Figure 5:
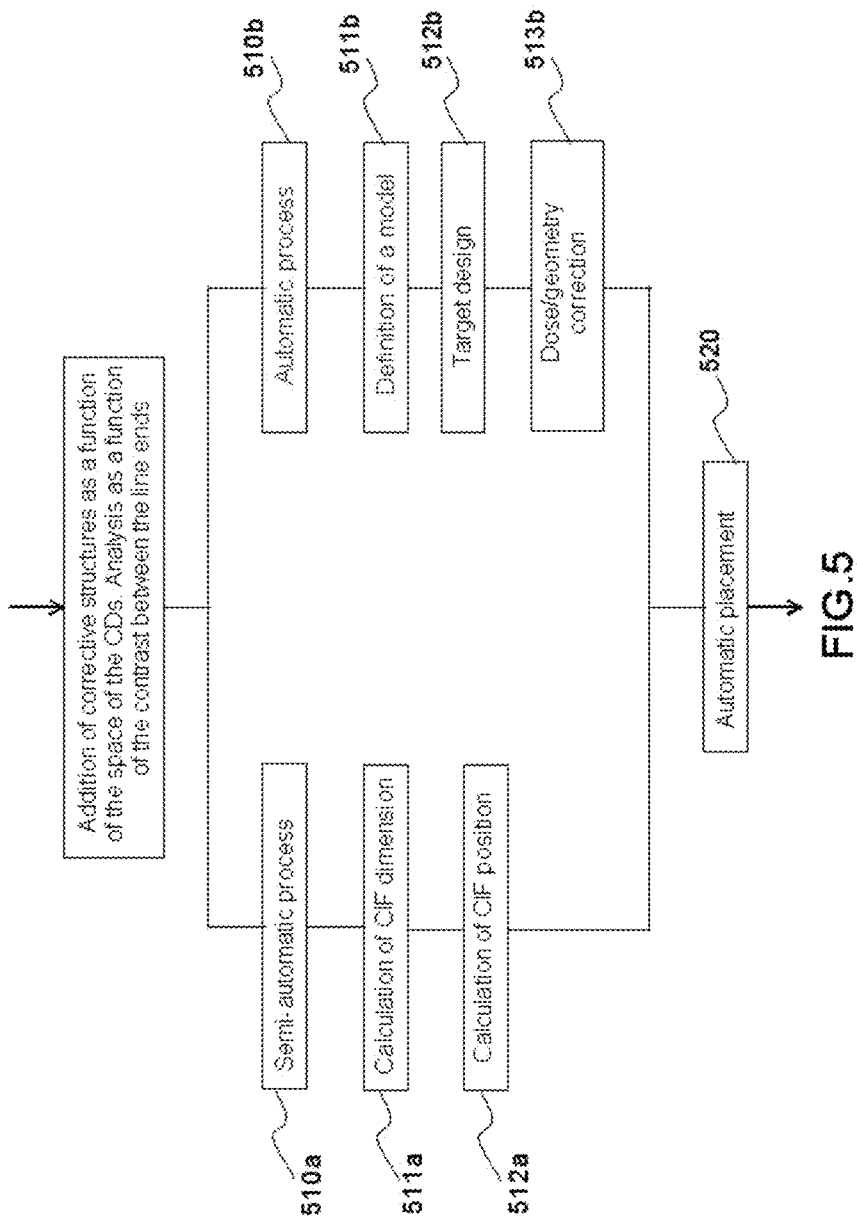
FIG. 5 is a detail of a step of the flowchart of FIG. 4 according to two embodiments of the invention.

Step 460 of adding the CIFs is commented on in detail in connection with FIG. 5.

The modified layout is thereafter verified in the course of a step 470. In particular, the line end spaces, possible CD errors, fracturation defects and the dose calculations are verified.

In the case where a method of lithography based on shape projection is used, a step 480 of fracturing the design to be reproduced into elementary shapes to be projected is carried out thereafter.

In the course of a step 490 the proximity effects of different nature of the LESs, notably those which occur at a dense network edge, are corrected. A prior art method can be used for this purpose, such as that calling upon modulation of the radiation doses as a function of the position of the shot in the network. But it is also possible to use the method of the invention forming the subject of patent application Ser. No. 10/52,862 filed by the applicant of the present application. In this case, the correction involves resizing the lines making it possible to reduce the doses radiated by these shots.

In the course of steps 4A0, 4B0 and 4C0, the final design data are respectively converted into machine format, transferred to the exposure machine and used by said machine to carry out the exposure.

In the method of the invention, it is possible to use any electron-beam lithography device, for example a machine with the VISTEC™ or ADVANTEST™ brand name. Its drive software is adapted so as to be able to implement the various steps described hereinabove.

FIG. 5 is a detail of a step of the flowchart of FIG. 4 according to two embodiments of the invention.

Step 460 of FIG. 4 is now detailed. This step consists in calculating the dimensions of the CIFs to be implanted as a function of the contrast of the line ends. This step 450 may be carried out in a semi-automatic manner or in a completely automatic manner.

In the first case, in the course of this step, 510a, we define a new pattern to be etched in the same manner as the base patterns to be overlaid onto the substrate. In the course of a step 511a, the dimensions of the CIFs are calculated and in the course of a step 512a the location of the CIFs is calculated with respect to the line ends according to procedures which are explained further on in the description. Next, in a conventional manner, the placement of the CIFs, whose parameters were entirely determined in the course of the previous steps, is performed in an automatic manner in the course of a step 520.

In the second case, in the course of a step 510b, the dimensions and the locations of the CIFs are defined in an entirely automatic manner using an approach based on a modeling of the CIF structures to be implanted as a function of the characteristics of the network of lines to be etched. In the course of a step 511b, the model to be applied is defined and, in the course of a step 512b, the target design is defined. This modeling is explained as a commentary to FIGS. 8 and 9 hereinbelow.

By way of variant embodiment, it is possible to perform, in the course of a step 513b, a resizing of the target design using the method of combined optimization of the geometry of the CIF and of the lines and of the modulation of dose radiated according to the method disclosed by the patent application filed by the applicant of the present application under the Ser. No. 10/52,862.

According to the method described by this patent application, which is aimed at a correction of the proximity effects inherent in lithography methods for geometries of less than 50 nm, the doses to be applied in the shots corresponding to the patterns of the CIF and of the critical lines are calculated either by convolving the dose radiated with the pattern to be etched or by using a table of parameters. The combined calculation of the modulation of dose to be applied and of the size of the new patterns is performed so as to preserve the process energy latitude according to a calculation an example of which is given hereinbelow as a commentary to FIG. 6.

Figure 6:
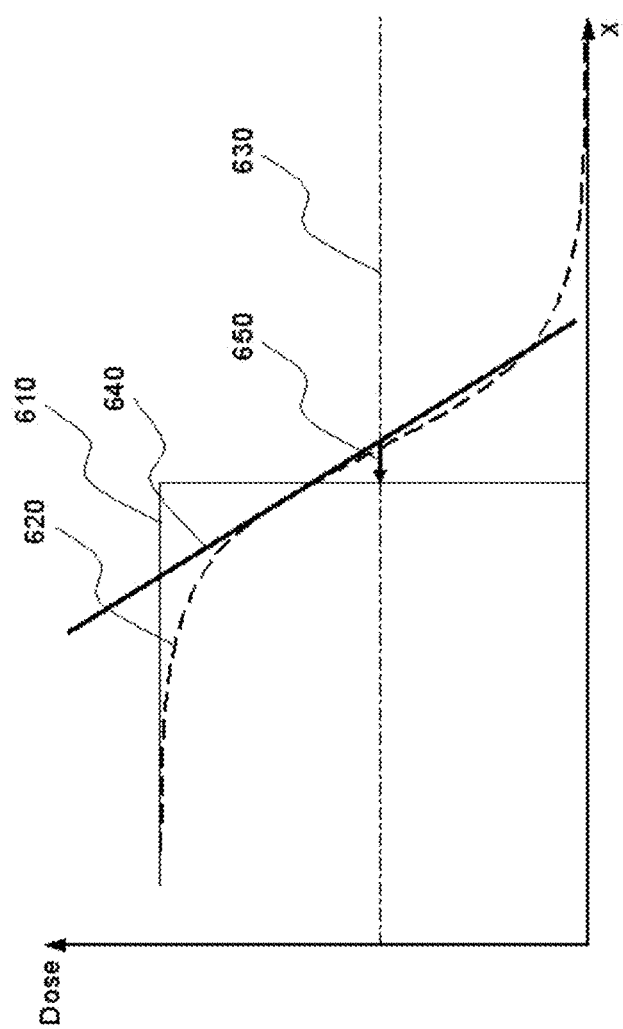
FIG. 6 illustrates the method of resizing the geometries to be etched according to a variant of the invention.

FIG. 6 illustrates the method of resizing the geometries to be etched according to a variant of the invention.

The geometry of the patterns is modified in at least one dimension so as to optimize the process energy latitude. More precisely, the displacement 650 to be performed along this dimension is calculated by seeking the intersection of the straight line 640 (tangent to the curve of dose received 620 at the point where the dose received is equal to the sensitivity threshold of the resin at 0.5) with the straight line 630 which demarcates said sensitivity threshold, and then by performing the displacement toward the point of intersection of the latter straight line with the profile of the radiated dose 610.

The geometry and/or the dose of the patterns is/are modified in at least one of the dimensions so as to optimize the energy latitude or the shape or the position of the critical lines. It is possible to calculate the displacement 650 by performing progressive increments of said geometry and by adjusting the direction and value of these increments after having compared the quantity to be optimized (geometry or latitude or combination of the two or any other cost function) with an objective. The displacement 650 can be done using any other approach used in optimization or servocontrol problems.

The dose/patterns combined calculation may be iterated two or three times.

The modulation of the dose to be applied to the patterns can also be calculated on the basis of a table of parameters without any convolution calculation, notably when the modulation is applied only to the shots outside of the patterns, the other shots being applied at the normalized value of the method, or at a value of the order of 30% below the latter.

The following figures illustrate the rules for calculating the variations to be applied to the parameters for dimensioning the "main line" (or line of the pattern to be etched) to and of the CIFs which are defined hereinafter:

L (main line) is the width of the main line to be etched;
I (main line) is the length of the main line to be etched;
L (CIF) is the common width of each CIF to be implanted;
$I_i$ (CIF) are the lengths characteristic of each CIF to be implanted;
S1 is the dimension of the gap between two opposite main lines;
S2 is the dimension of the gap between two CIFs along the direction of the main line;
S3 is the dimension of the gap between a CIF and the main line along the direction perpendicular to the main line;
S4 is the dimension of the gap between a CIF and the main line along the direction of the main line;
S5 is the dimension of the gap between two CIFs along the direction perpendicular to the main line.

By reference to FIG. 7 which illustrates the calculation of the parameters of the method of the invention in one of the types 310 and 320 of FIG. 3, the rules for calculating the parameters of the main line and the CIFs are indicated:

The parameters L (main line) and I (main line) are not modified;

The parameter S1 is fixed by the minimum of the Design Rule Manual (DRM); in the case of the 22-nm process and of a suitable resin, it is equal to about 30 nm;
L (CIF) and $I_i$ (CIF) are between about 5 and 20 nm;
S2 and S3 are fixed at values of between about 5 and 20 nm.

Advantageously, it is possible to carry out a pullback in the case of the dense structures in 16 nm technology. This pullback will achieve a gain in contrast with respect to a solution without pullback which is the reference solution for the CIFs of these two types for the less fine technologies.

By reference to FIG. 8 which illustrates the calculation of the parameters of the method of the invention in one of the types 340 and 350 of FIG. 3, the rules for calculating the parameters of the main line and the CIFs are indicated:

The parameter L (main line) is corrected of a shrinkage calculated as a function of the CIF;
The parameter I (main line) is not modified;
The parameter S1 is fixed by the minimum of the Design Rule Manual (DRM); in the case of the 22-nm process and of a suitable resin, it is equal to about 30 nm;
L (CIF) and $I_i$ (CIF) are between about 5 and 50 nm;
S2 is fixed at a value of between about 5 and 100 nm as a function of the shrinkage of the main line;
S4 is fixed at a value of between about 5 and 50 nm.

By reference to FIG. 9 which illustrates the calculation of the parameters of the method of the invention in the type 330 of FIG. 3, the rules for calculating the parameters of the main line and the CIFs are indicated:

The parameter L (main line) is corrected of a shrinkage calculated as a function of the CIF;
The parameter I (main line) is not modified;
The parameter S1 is fixed by the minimum of the Design Rule Manual (DRM); in the case of the 22-nm process and of a suitable resin, it is equal to about 30 nm;
L (CIF) and I (CIF) are between about 5 and 50 nm;
S2 is fixed at a value of between about 5 and 100 nm as a function of the shrinkage of the main line;
S3 is fixed at a value of between about 5 and 50 nm.

FIGS. 9a, 9b and 9c illustrate the calculation of the parameters of the method of the invention respectively in the types 370, 380 and 390 of FIG. 3a; the rules for calculating the parameters of the main line and the CIFs are indicated hereinbelow:

The parameter L (main line) is corrected of a shrinkage calculated as a function of the CIF;
The parameter I (main line) is not modified;
The parameter S1 is fixed by the minimum of the Design Rule Manual (DRM); in the case of the 22-nm process and of a suitable resin, it is equal to about 30 nm;
L (CIF) and I (CIF) are between about 5 and 50 nm;
S2 is fixed at a value of between about 5 and 100 nm as a function of the shrinkage of the main line;
S3, S4 and S5 are fixed at values of between about 5 and 50 nm.

The parameters of FIGS. 8, 9, 9a, 9b and 9c hereinabove are optimized by trial and error, the optimal values being thereafter integrated into charts called by the models for generating corrections.

FIGS. 10a, 10b and 10c illustrate the results of an LES correction method of the prior art.

FIG. 10a illustrates a simulation of two lines etched by using a method of electron-beam lithography applying LES corrections of the prior art, such as that shown diagrammatically in FIG. 2: it is clearly seen that the line ends are not controlled and that in particular the line end shrinkages are too considerable, and in a large number of cases this will necessarily cause short-circuit problems fatal to the integrated circuit etched according to this method. FIG. 10*b* shows in a graphical manner a result of simulating the dose received as a function of distance from the starting point of the line. FIG. 10*c* is a photograph of the etched circuit.

FIGS. 11*a*, 11*b*, 11*c* and 11*d* illustrate the results of an LES correction method in an embodiment of the invention.

FIG. 11*a* illustrates a simulation of two lines etched by using a method of electron-beam lithography applying LES corrections according to one embodiment of the invention (that of the type 320 of FIG. 3, illustrated in this example in FIG. 11*d*): it is seen in FIG. 11*a* and in FIG. 11*c* that the line ends are much better controlled than in the application of the method of the prior art illustrated by FIGS. 10*a*, 10*b* and 10*c*, and that exactly what is desired in the design is obtained. This result is confirmed by the simulation graph of FIG. 11*b* where it is noted that the effect of the CIFs is to bring the line ends closer together.

The exemplary embodiments of the present description have been given in the case of a method of electron-beam lithography by direct writing. The invention is, however, applicable to mask etching, which will be used thereafter for writing by electron-beam radiation.

The examples described hereinabove are therefore given by way of illustration of certain embodiments of the invention. They do not in any way limit the field of the invention which is defined by the claims which follow.

The invention claimed is:

1. A method of electron-beam lithography of networks of lines on a resin-coated substrate, said method being implemented by an electron-beam lithography equipment and a simulation equipment, the method comprising:
    selecting, at the simulation equipment, at least two opposite lines of the networks each opposite line having a critical line end in opposition to a critical line end of another opposite line;
    determining, at the simulation equipment, corrections to be applied to geometries of the critical line ends of said two opposite lines;
    determining, at the simulation equipment, a type of at least one contrast intensification structure chosen from among several patterns, said contrast intensification structure comprising at least two elements, at least one of which being located in-between said two opposite lines;
    calculating, at the simulation equipment, characteristic dimensions and a location of said contrast intensification structure in a gap between the critical line ends of said two opposite lines;
    generating, using the electron-beam lithography equipment, said contrast intensification structure; and
    placing, using the electron-beam lithography equipment, said contrast intensification structure in relation to the critical line ends of said two opposite lines as a function of determined parameters.

2. The method as claimed in claim 1, wherein said contrast intensification structure is an H-like structure, whose branches each has inherent dimensions of between about 5 and 50 nm, whose branch perpendicular to a direction in which said critical line is placed in a middle of the gap at a distance S2 from the end of said critical line along a direction parallel to said critical line of between about 5 and 50 nm and whose branches parallel to the direction of said critical line are placed in a symmetric manner on either side of said critical line at a distance S3 perpendicular to the direction of said critical line of between about 5 and 50 nm.

3. The method as claimed in claim 1, wherein said contrast intensification structure consists of two parallel bars placed in a symmetric manner in the gap along a direction perpendicular to said critical line, each of the bars having inherent dimensions of between about 5 and 50 nm, spaced apart by a distance S2 of between about 5 and 100 nm and each spaced from the end of said critical line by a distance S4 parallel to said critical line of between about 5 and 50 nm.

4. The method as claimed in claim 3, wherein said two parallel bars furthermore comprise four regions at each of their ends, each of said four regions having inherent dimensions of between about 5 and 50 nm.

5. The method as claimed in claim 1, wherein said contrast intensification structure comprises at least two contrast improvement features (CIFs) having inherent dimensions of substantially between 5 and 50 nm, said patterns being separated from one another by a distance S5 perpendicular to the critical line ends of substantially between 5 and 20 nm, a number of patterns being chosen in such a way that exterior regions are placed in a symmetric manner on either side of edges of the critical line ends at a distance S3 perpendicular to the direction of said critical lines of between about 5 and 50 nm.

6. The method as claimed in claim 1, wherein said contrast intensification structure includes two rows of substantially square regions passing through an interior of the gap of an inherent dimension substantially between 5 and 20 nm, the two rows being separated by a distance S1 in the direction of the critical line end of substantially between 5 and 50 nm, a number of said square regions being chosen in such a way that exterior regions are placed in a symmetric manner on either side of edges of the critical line ends at a distance S3 perpendicular to the direction of said critical lines of between about 5 and 50 nm.

7. The method as claimed in claim 1, wherein in determining types of a plurality of contrast intensification structures, dimensions and locations of the plurality of contrast intensification structures are determined by a model for automatically determining a target design comprising the critical line ends and optimal contrast intensification structures.

8. The method as claimed in claim 1, further comprising:
    at least one step of calculating at least one dimension of each said critical line end and at least one dimension of an associated contrast intensification structure, and
    a step of calculating modulation of doses on each said critical line end and the associated contrast intensification structure, said calculating the at least one dimension and said calculating the modulation of doses being related by an optimization criterion chosen from a group comprising a process energy latitude, a shape of the contrast intensification structure, a location of said contrast intensification structure, a combination of the location with the process energy latitude.

9. A computer program product comprising program code instructions in a plurality of modules, which when executed by a processor of a computer, causes the processor to execute a method of electron-beam lithography of networks of lines on a resin-coated substrate, said computer program product comprising:
    a module for selecting at least two opposite lines of the networks each opposite line having a critical line end in opposition to a critical line end of the other opposite line;
    a module for determining corrections to be applied to geometries of the ends of said two opposite lines;
    a module for determining a type of at least one contrast intensification structure chosen from among several patterns, said contrast intensification structure comprising at least two elements, at least one of which being located in-between said two opposite lines;

a module for calculating characteristic dimensions and a location of said contrast intensification structure in a gap between the critical line ends of said two opposite lines;

a module for generating said contrast intensification structure; and a module for placing said contrast intensification structure in relation to the critical line ends of said two opposite lines as a function of determined parameters.

10. The computer program product as claimed in claim 9, further comprising:

a module for calculating at least one dimension of said critical line end and at least one dimension of an associated contrast intensification structure; and a module for calculating modulation of doses on said critical line end and said associated contrast intensification structure, calculations performed by said module for calculating the at least one dimensions and the module for calculating the modulation of doses being related by an optimization criterion chosen from a group comprising a process energy latitude, a shape of the associated contrast intensification structure, a location of said associated contrast intensification structure, a combination of the location with the process energy latitude.

* * * * *